(12) United States Patent
Su et al.

(10) Patent No.: US 11,191,171 B2
(45) Date of Patent: Nov. 30, 2021

(54) ELECTRONICS DEVICE HAVING A PLASTIC COVER WITH A SEALED CENTER BOSS

(71) Applicant: Continental Automotive Systems, Inc., Auburn Hills, MI (US)

(72) Inventors: Patrick Su, Shelby Township, MI (US); Ravi Kiran Kothamasa, Lake Orion, MI (US); Kevin D Moore, Bloomfield Hills, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 16/788,550

(22) Filed: Feb. 12, 2020

(65) Prior Publication Data

US 2021/0251088 A1   Aug. 12, 2021

(51) Int. Cl.
  *H05K 5/00*   (2006.01)
  *H05K 5/03*   (2006.01)
  *H05K 7/14*   (2006.01)

(52) U.S. Cl.
  CPC .......... *H05K 5/0013* (2013.01); *H05K 5/03* (2013.01); *H05K 7/1427* (2013.01); *H05K 5/0017* (2013.01)

(58) Field of Classification Search
  USPC ........................ 361/752, 796, 800
  See application file for complete search history.

(56) References Cited

U.S. PATENT DOCUMENTS

| | | | | |
|---|---|---|---|---|
| 6,570,089 B1 * | 5/2003 | McGrew | ............... | H02G 3/086 174/50 |
| 7,048,564 B1 * | 5/2006 | Hinze | ............... | B60R 16/0239 361/742 |
| 7,358,438 B2 * | 4/2008 | Zoller | ............... | B60R 16/0239 174/50 |
| 7,570,496 B2 * | 8/2009 | Chen | ............... | H05K 5/062 361/818 |
| 8,253,042 B2 * | 8/2012 | Trenner | ............... | H05K 5/0091 174/562 |
| 2007/0158011 A1 | 7/2007 | Tominaga et al. | | |
| 2010/0187007 A1 | 7/2010 | Trenner et al. | | |
| 2012/0074153 A1 * | 3/2012 | Yang | ............... | H04M 1/18 220/694 |
| 2015/0282351 A1 | 10/2015 | Bonvallat et al. | | |

FOREIGN PATENT DOCUMENTS

JP    2001096628 A    4/2001

OTHER PUBLICATIONS

International Search Report and the Written Opinion of the International Searching Authority dated May 10, 2021 for the counterpart PCT Application No. PCT/US2021/070141.

* cited by examiner

*Primary Examiner* — Hung S. Bui (57) ABSTRACT

An electronics device includes a housing having a through-hole disposed in a central portion of the housing. A printed circuit board is connected to the housing. The printed circuit board includes one or more electronic components disposed thereon. A plastic housing cover is connected to the housing and covers the printed circuit board. The housing cover includes a centrally-located post member integral to the housing. The post member extends through the through-hole of the housing and engages with the housing. The engagement between the housing and the housing cover prevents outward deflection of the housing cover.

20 Claims, 6 Drawing Sheets

ELECTRONICS DEVICE HAVING A PLASTIC COVER WITH A SEALED CENTER BOSS

FIELD OF INVENTION

The present invention generally relates to a housing cover for the housing of an electronics control unit which prevents outward deflection of the cover.

BACKGROUND

Electronic control units are typically installed in the engine compartment of a vehicle. The control unit typically controls many of the functions of the vehicle such as the fuel injector drivers, engine operations, etc., by controlling a series of actuators based on input from sensors. Typical control units have a circuit board that is disposed in a housing. A cover, mounted to the housing, covers the circuit board. When a vehicle and thus the control unit are exposed to high altitudes, internal pressure can build up inside the control unit. In a sealed control unit where the cover is sealed with respect to the housing, such internal pressure may cause the cover to deflect outwardly, reducing the effectiveness of the sealing arrangement. Using a vent in the control unit could equalize the pressure inside the housing, but this solution cannot be used when customers demand a sealed ECU. Cover deflection can be limited by using a cast cover. However, a cast cover is expensive and very heavy. Some existing implementations utilize screws and related hardware for securing a central portion of the cover to the housing, but such solutions are not cost effective.

SUMMARY

Example embodiments are generally directed to a method for assembling an electronics device and a resulting electronics device which is relatively simple in design and inexpensive to manufacture.

According to an example embodiment, an electronics device includes a housing having a through-hole disposed in a central portion of the housing. A printed circuit board is connected to the housing and includes one or more electric or electronic components disposed thereon. A housing cover is connected to the housing and covers the printed circuit board. The housing cover includes a centrally-located post member integral to the housing. The post member extends through the through-hole of the housing and engages with the housing. The engagement between the housing and the housing cover prevents outward deflection of the housing cover.

The housing cover has a plastic composition. A distal end portion of the post member is formed around the through-hole of the housing, thereby forming the engagement. The distal end portion extends over the housing which defines the through-hole.

In one implementation, the housing cover further includes a protrusion which extends from the housing cover and surrounds the post member along a lengthwise segment thereof. The housing also includes a notch and a distal end portion of the protrusion is disposed in the notch. A sealant is disposed in the notch and contacts the distal end portion of the protrusion. The sealant forms a seal between the housing and the housing cover.

In another implementation, a portion of the housing which defines the through-hole flares towards the housing cover. A sealant is disposed between an outer surface of the portion of the housing and an outer surface of the post member.

Another embodiment is directed to a method for assembling an electronics device. The method includes obtaining a housing having a through-hole disposed along a central portion thereof, a printed circuit board at least partly populated with electronic devices, and a plastic housing cover having a post member extending from an inner surface thereof. The method further includes securing the printed circuit board to the housing, placing the housing cover over the printed circuit board so that the post member extends through the through-hole of the housing, and securing the housing cover to the housing. Heat and pressure are applied to a distal end portion of the post member so that the post member is formed over a portion of the housing which defines the through-hole and engages with the housing portion. This engagement prevents outward deflection of the housing cover.

The housing cover includes a protrusion which surrounds the post member along a lengthwise segment thereof, and the method further includes placing a sealant along the housing so that the sealant contacts the protrusion during placing of the housing cover. The sealant forms a seal with the protrusion. In particular, the housing includes a notch and placing the sealant includes placing the sealant in the notch. In an implementation, a portion of the housing which defines the through-hole is flared toward the housing cover, and placing the sealant includes placing the sealant so that the sealant contacts an outer surface of the portion of the housing.

BRIEF DESCRIPTION OF THE DRAWINGS

Aspects of the invention will be explained in detail below with reference to exemplary embodiments in conjunction with the drawings, in which.

DETAILED DESCRIPTION

The following description of the example embodiment(s) is merely exemplary in nature and is in no way intended to limit the invention, its application, or uses. In the figures and throughout the detailed description, the same reference numbers are used to identify identical or similar elements. For the sake of clarity, the elements are not shown to scale unless otherwise specified.

In general terms, example embodiments are directed to an electronics device including a housing and a housing cover, in which the housing cover is engaged in a screw-less and/or screw-free manner with the housing in a central region of the housing cover such that the housing cover is prevented from outwardly deflecting in varying pressure and temperature conditions. The electronics device may be, for example, an electronics control unit of a vehicle.

Figure 1:
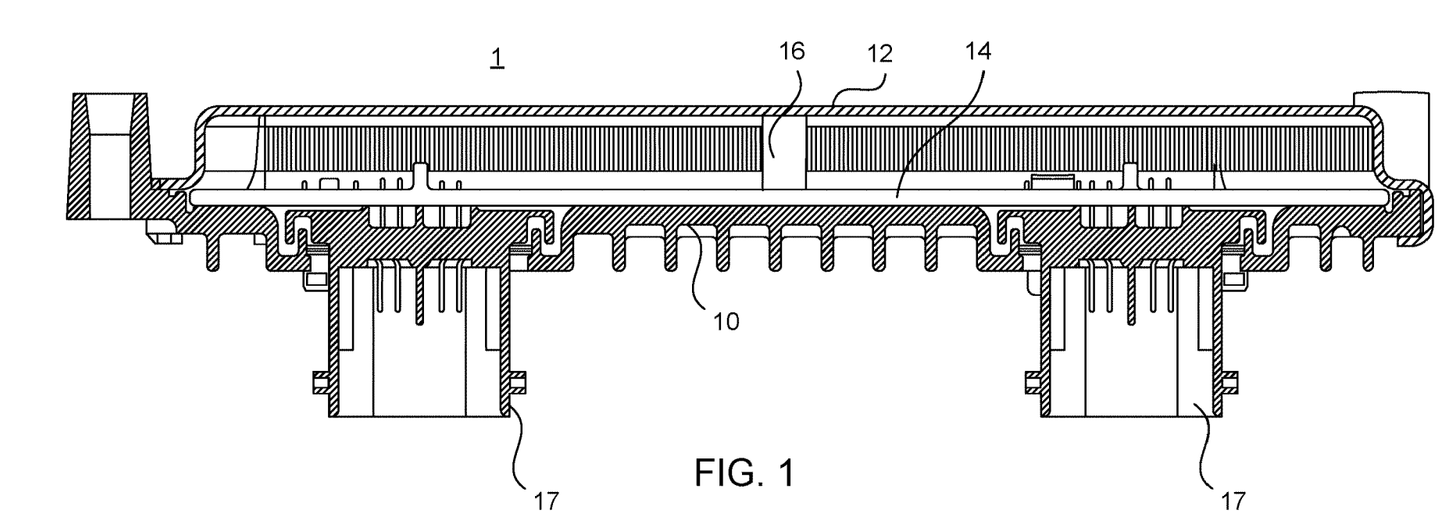
FIG. 1 is a cross sectional side view of an electronics device according to an example embodiment.

FIG. 1 illustrates an electronics device 1 having a housing 10 and housing cover 12 which is attached to housing 10 via screws or other attachment mechanisms. A printed circuit board (PCB) 14 is disposed within an interior of housing 10 and attached thereto. PCB 14 may be at least partly populated with electrical and/or electronic components 14A (FIG. 3) which are electrically connected to each other and together perform one or more predetermined functions during operation of the electronics device. Housing 10 includes one or more sockets 17 which provide electrical connectivity between the electrical and/or electronic components 1A4 and devices external to electronics device 1. Housing cover 12 is constructed from a plastic composition.

Figure 2:
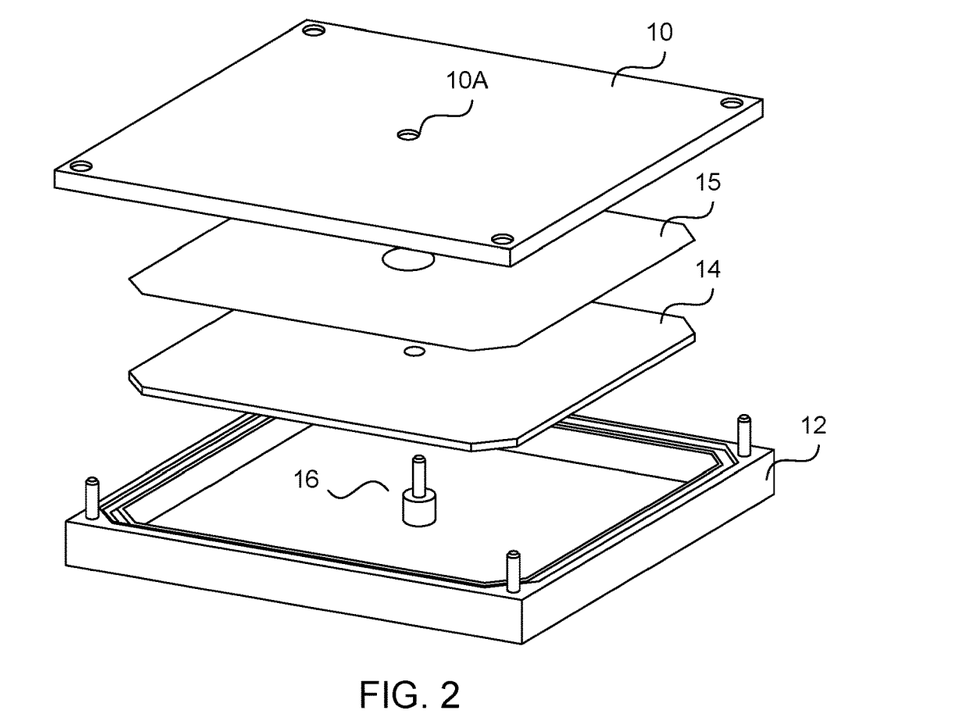
FIG. 2 is an exploded perspective view of the electronics device of FIG. 1.
Figure 3:
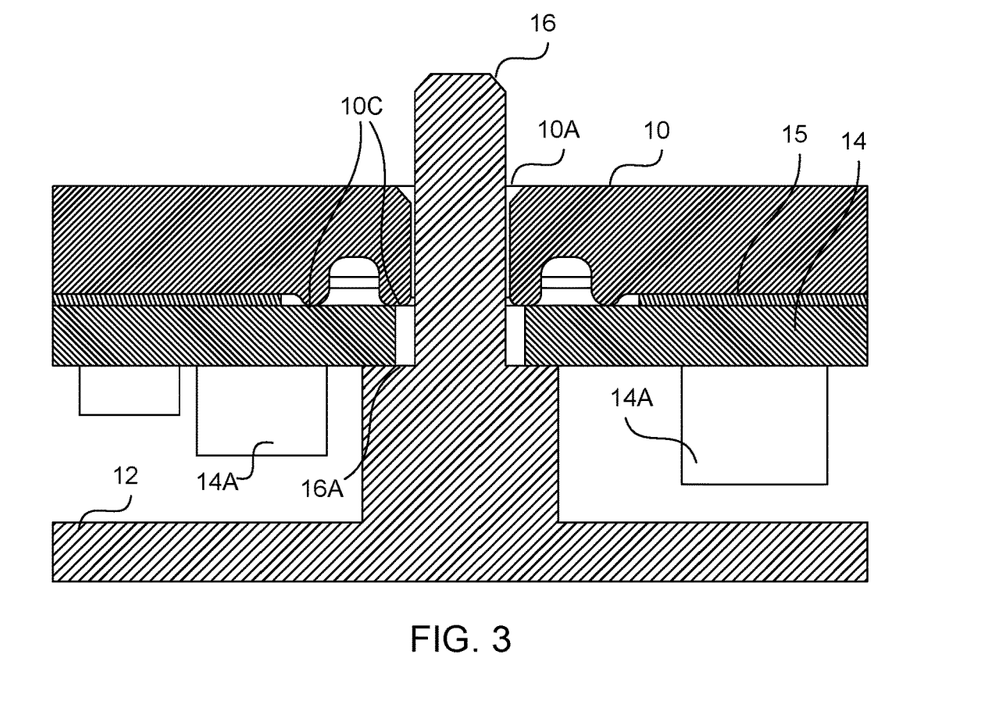
FIG. 3 is a partial cross sectional side view of the electronics device of FIG. 1 prior to engagement of the housing cover to the housing.

With reference to FIGS. 2 and 3, electronics device 1 further includes a thermal interface material 15 disposed between PCB 14 and housing 10. Thermal interface material 15 is constructed from a thermally conductive composition so as to provide a thermal conductive path between PCB 14 and housing 10 for cooling PCB 14 and particularly cooling the electronics components 14A.

Electronics device 1 may be operated in different atmospheric conditions which may result in pressure forces on housing cover 12 in a direction away from housing 10. In order to prevent outward deflection of housing cover 12, housing cover 12 is connected to housing 10 in a central region of the housing cover. Housing cover 12 includes a post member 16 which extends from a central region of the cover and fixedly attaches to housing 10. This fixed attachment in the central region of housing cover 12 advantageously serves to prevent outward deflection of the cover in a direction away from housing 10.

According to an example embodiment, post member 16 is integrally formed with plastic housing cover 12. In one implementation, housing cover 12 is formed as a molded member with post member 16. In another implementation, post member 16 is adhered to or otherwise attached to housing cover 12 so as to be integrally formed with the cover. Post member 16 extends from an inner surface of housing cover 12. As shown in FIG. 3, post member 16 includes a shoulder 16A on which PCB 14 rests.

Best seen in FIGS. 2 and 3, housing 10 includes a through-hole 10A disposed in a central region of the housing. In particular, through-hole 10A is disposed so that post member 16 of housing cover 12 extends through through-hole 10A (FIG. 3). In addition, housing 10 includes shoulders 10C which extend towards PCB 14 and provide contact surfaces against which PCB 14 is disposed, thereby providing a more stable and rigid connection between housing 10 and housing cover 12 in the region around post member 16. Each shoulder 10C has an annular shape. In the embodiment illustrated in FIGS. 2 and 3, shoulders 10C surround post member 16 along a lengthwise segment thereof. It is understood that shoulders 10C may have shapes other than annular shapes, and that more or less than two shoulders 10C may be utilized.

In the example embodiments, post member 16 is fixed to housing 10. With housing 10 being fixed to housing cover 12 via post member 16, and with post member 16 being disposed along a central region of housing cover 12, the housing cover is prevented from outwardly deflecting and/or bowing.

Figure 4:
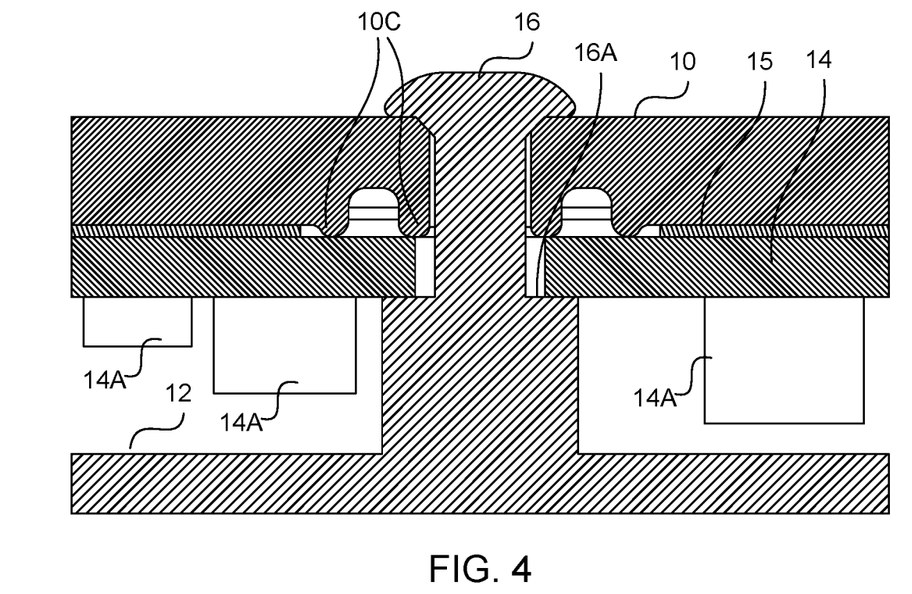
FIG. 4 is a partial cross sectional side view of the electronics device of FIG. 1 with the housing cover attached to the housing of the electronics device.
Figure 5:
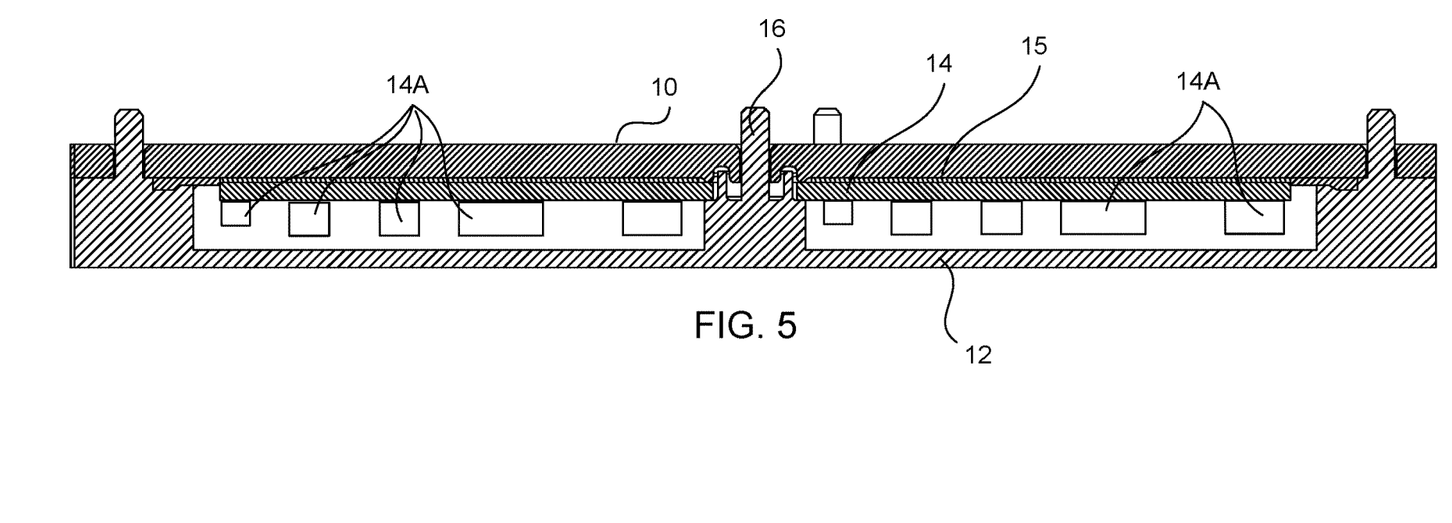
FIG. 5 is a simplified cross sectional side view of the electronics device of FIG. 1 prior to engagement of the housing cover to the housing.
Figure 6:
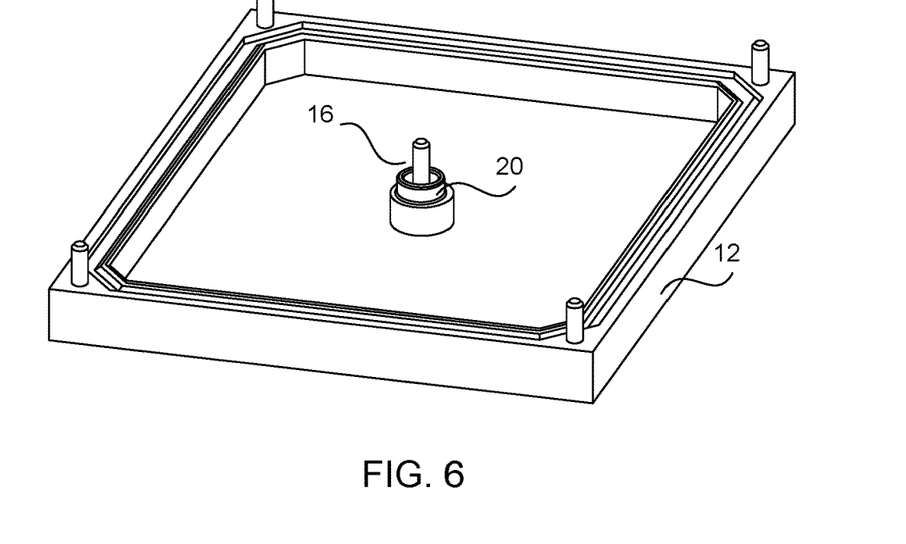
FIG. 6 is a perspective view of the housing cover of FIG. 1 according to another example embodiment.

In one implementation, post member 16 is fixed to housing 10 using hot air riveting and/or heat staking. Specifically, with post member 16 extending through through-hole 10A, post member 16 is subjected to heated air (i.e., a non-contact heat application) so that the distal end of post member 16 may be formed and/or plastically deformed into a different shape. A tool at a cooler temperature is used to form, clamp and cool the stake (post member 16) under pressure. Whereas FIGS. 2 and 3 show post member 16 prior to the hot air riveting and/or heat staking, FIG. 4 shows post member 16 following its forming and cooling. As shown, the distal end portion of post member 16 is formed over the portion of housing 10 which defines through-hole 10A, thereby securing post member 16 (and with it cover 12) to housing 10. It is understood that hot air riveting and heat staking is very well known such that a more detailed description of the process of reshaping and/or plastically deforming the distal end of post member 16 will not be provided for reasons of expediency.

Figure 7:
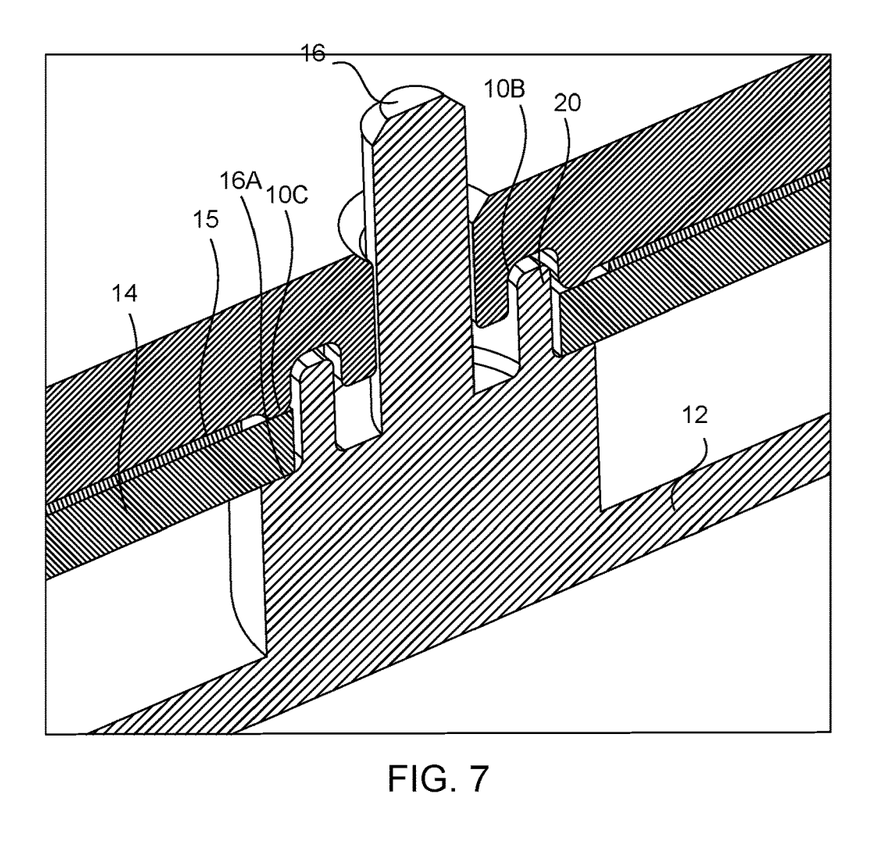
FIG. 7 is a perspective cross sectional view of the electronics device with the housing cover of FIG. 6 prior to engagement of the housing cover to the housing.
Figure 8:
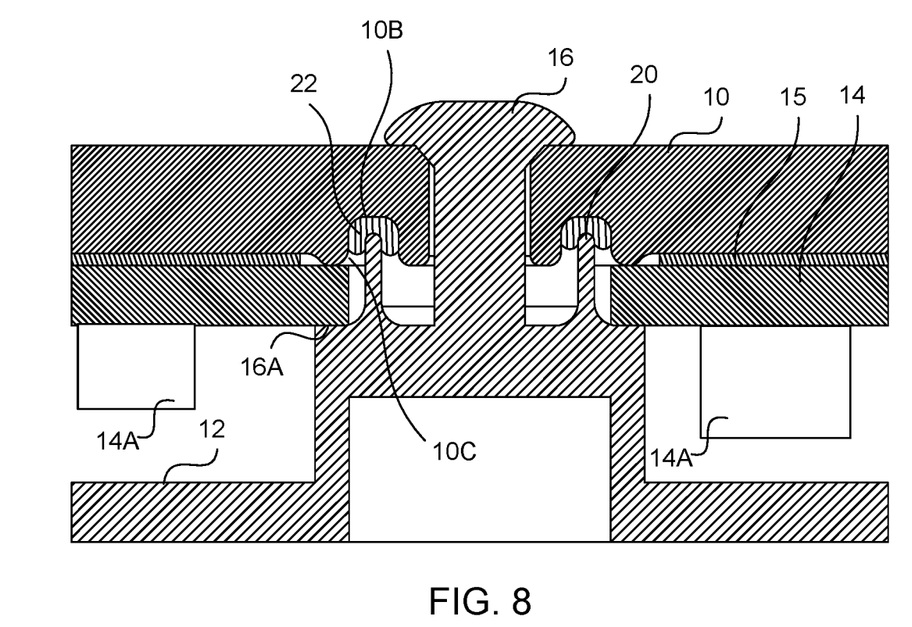
FIG. 8 is a partial cross sectional side view of the electronics device with the housing cover of FIG. 6 with the housing cover attached to the housing of the electronics device.

In another example embodiment, electronics device 1 includes a member which provides additional sealing between housing 10 and housing cover 12. With reference to FIGS. 5-8, housing cover 12 includes protrusion 20 which extends from the housing cover and surrounds post member 16 along a lengthwise segment thereof. Protrusion 20 is illustrated as having a largely cylindrical shape but it is understood that protrusion 20 may have different shapes. In addition, housing 10 includes a notch 10B defined along an inner surface of the housing. Notch 10B is sized and dimensioned for receiving the distal end portion of protrusion 20, as shown in FIGS. 7 and 8, thereby forming a tongue-in-groove structure. A sealant 22 is disposed in notch 10B between, and contacts, housing 10 and protrusion 20 and thereby provides a seal between housing 10 and housing cover 12 (FIG. 8). Sealant 22 may be applied to notch 10B prior to application of the hot air riveting/heat staking treatment to reshape and connect post member 16 to housing 10. In this example embodiment, a single shoulder 10C is utilized for providing a rigid connection between housing 10 and housing cover 12 in the region of post member 16.

Figure 9:
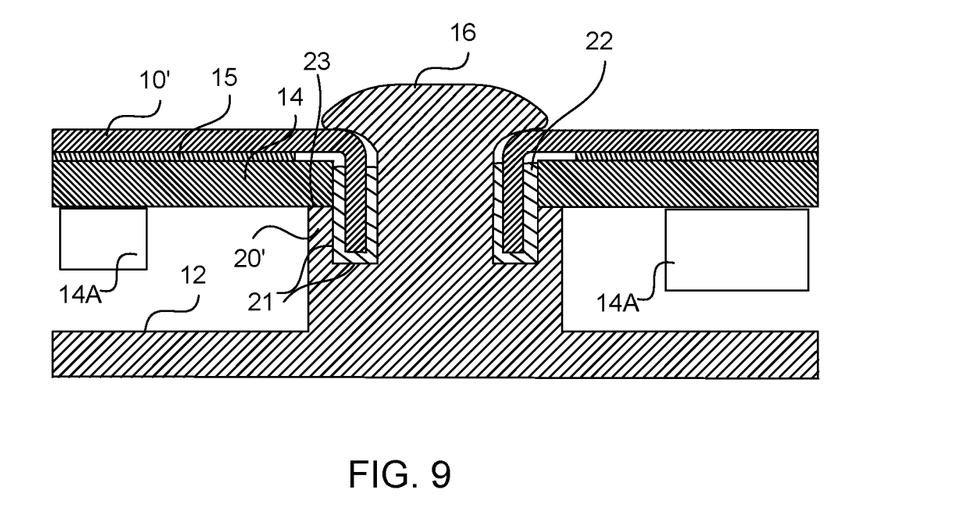
FIG. 9 is a partial cross sectional view of the electronics device of FIG. 1 according to another example embodiment with the housing cover attached to the housing of the electronics device.

FIG. 9 illustrates a third example embodiment. This embodiment includes a housing 10' formed from sheet metal. As shown, the portion of housing 10' which defines through-hole 10A is inwardly flared towards housing cover 12. In addition, housing cover 12 includes a protrusion 20' which extends from the housing cover, largely surrounds post member 16 along a lengthwise segment thereof, and provides a contact surface 23 against which PCB 14 is disposed. Protrusion 20' and PCB 14 form a groove 21 which surrounds the lengthwise segment of post member 16. The distal end of the flared portion of housing 10' is disposed within protrusion 20' and in particular in groove 21, thereby forming a tongue-in-groove structure. In an example embodiment, the flared end of housing 10' may be disposed in the central part of groove 21, largely equally spaced between post member 16 and protrusion 20'. Prior to subjecting post member 16 to the above-mentioned hot air riveting/heat staking process, sealant 22 is disposed in groove 21 such that sealant 22 surrounds the flared end of housing 10' and forms a seal between the flared end and housing cover 12. Sealant 22 may be inserted into groove 21 prior to or after the flared end of housing 10' is inserted in groove 21.

Figure 10:
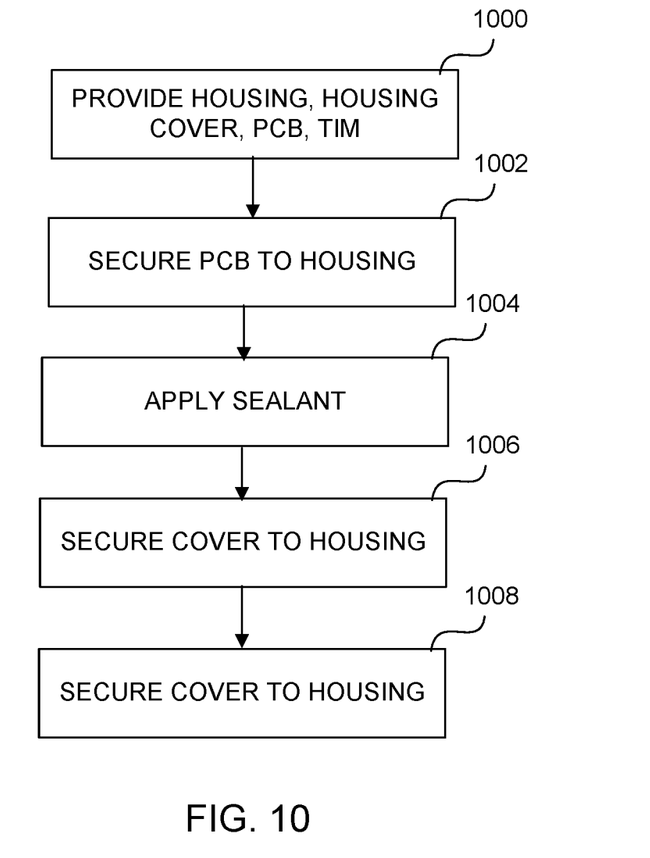
FIG. 10 is a flowchart for assembling the electronics device of FIG. 1.

The method of assembling electronics device 1 will be described with reference to FIG. 10. It is understood that the order of actions described below may be performed in an order that is different from that depicted in FIG. 10. Initially, housing 10, PCB 14, thermal interface material 15 and housing cover 12 are provided at 1000. PCB 14 is secured to housing 10 at 1002, such as with one or more screws, an adhesive or the like. Sealant 22 is applied to housing 10 and/or post member 16 at 1004. Housing cover 12 is then secured to housing 10 at 1006. This securement may be performed by the use of screws, adhesives or other known mechanisms. Securing housing cover 12 to housing 10 allows for sealant 22 to contact, dry/cure and form a seal between the cover and housing. Post member 16, which presently extends through through-hole 10A of housing 10, has a largely cylindrical shape. The hot air riveting and/or heat staking is performed at 1008 which reshapes the distal end of post member 16 so that it is disposed over the portion of housing 10 immediately surrounding through-hole 10A, thereby engaging the central portion of housing cover 12 to housing 10.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. An electronics device, comprising:
a housing, the housing including a through-hole disposed in a central portion of the housing;
a printed circuit board connected to the housing, the printed circuit board including one or more electric or electronic components disposed thereon; and
a housing cover connected to the housing and covering the printed circuit board, the housing cover including a centrally-located post member integral to the housing, the post member extending through the through-hole of the housing and engages with the housing, the engagement between the housing and the housing cover preventing outward deflection of the housing cover,
wherein the housing cover further comprises a centrally-located protrusion which extends from the housing cover and surrounds the post member along a lengthwise segment thereof.

2. The electronics device of claim 1, wherein the housing cover comprises a plastic composition.

3. The electronics device of claim 2, wherein a distal end portion of the post member is formed around the through-hole of the housing, thereby forming the engagement.

4. The electronics device of claim 3, wherein the distal end portion extends over the housing which defines the through-hole.

5. The electronics device of claim 1, wherein the housing includes a notch formed in centrally-located portion of the housing and a distal end portion of the protrusion is disposed in the notch.

6. The electronics device of claim 5, further comprising a sealant disposed in the notch and contacting the distal end portion of the protrusion, the sealant forming a seal between the housing and the housing cover.

7. The electronics device of claim 1, wherein the printed circuit board includes a through-hole through which the post member and the protrusion extend.

8. An electronics device, comprising:
a housing, the housing including a through-hole disposed in a central portion of the housing;
a printed circuit board connected to the housing, the printed circuit board including one or more electric or electronic components disposed thereon;
a housing cover connected to the housing and covering the printed circuit board, the housing cover including a centrally-located post member integral to the housing, the post member extending through the through-hole of the housing and engages with the housing, the engagement between the housing and the housing cover preventing outward deflection of the housing cover,
wherein a portion of the housing which defines the through-hole flares towards the housing cover, and
a sealant disposed between and contacting a surface of the portion and a surface of the post member.

9. The electronics device of claim 8, further comprising a protrusion which extends from the housing cover, wherein the protrusion, the printed circuit board and the post member form a groove in which the sealant and a at least a segment of the portion of the housing are disposed.

10. A method of assembling an electronics device, comprising:
obtaining a housing having a through-hole disposed along a central portion thereof, a printed circuit board at least partly populated with electronic devices, and a plastic housing cover having a post member extending from an inner surface thereof;
securing the printed circuit board to the housing;
placing the housing cover over the printed circuit board so that the post member extends through the through-hole of the housing;
securing the housing cover to the housing; and
applying heat and pressure to a distal end portion of the post member so that the post member is formed over a portion of the housing which defines the through-hole and engages with the housing portion, the engagement preventing outward deflection of the housing cover.

11. The method of claim 10, wherein the housing cover comprises a protrusion which surrounds the post member along a lengthwise segment thereof, and the method further comprises placing a sealant along the housing so that the sealant contacts the protrusion during placing the housing cover, the sealant forming a seal with the protrusion.

12. The method of claim 11, wherein a portion of the housing which defines the through-hole is flared toward the housing cover, and placing the sealant comprises placing the sealant so that the sealant contacts an outer surface of the portion of the housing.

13. The method of claim 10, wherein the housing comprises a notch and placing the sealant comprises placing the sealant in the notch.

14. An electronics device, comprising:
a housing, the housing including a through-hole disposed in a central portion of the housing;
a printed circuit board connected to the housing, the printed circuit board including one or more electronic components disposed thereon; and
a housing cover connected to the housing and covering the printed circuit board, the housing cover including a centrally-located post member integral to the housing, the post member extending through the through-hole of the housing and forms around a portion of the housing which defines the through-hole so as to engage the housing cover with the housing, the engagement between the portion of the housing and the housing cover preventing outward deflection of the housing cover, wherein the housing cover further comprises a centrally-located protrusion which extends from the housing cover and surrounds the post member along a lengthwise segment thereof.

15. The electronics device of claim 14, wherein the housing cover comprises a plastic composition.

16. The electronics device of claim 14, wherein the housing includes a notch and a distal end portion of the protrusion extends into the notch.

17. The electronics device of claim 16, further comprising a sealant disposed in the notch and contacting the distal end portion of the protrusion, the sealant forming a seal between the housing and the housing cover.

18. The electronics device of claim 14, wherein the printed circuit board includes a through-hole through which the post member and the protrusion extend.

19. An electronics device, comprising:
a housing, the housing including a through-hole disposed in a central portion of the housing;
a printed circuit board connected to the housing, the printed circuit board including one or more electronic components disposed thereon; and
a housing cover connected to the housing and covering the printed circuit board, the housing cover including a centrally-located post member integral to the housing, the post member extending through the through-hole of the housing and forms around a portion of the housing which defines the through-hole so as to engage the housing cover with the housing, the engagement between the portion of the housing and the housing cover preventing outward deflection of the housing cover, wherein a portion of the housing which defines the through-hole flares towards the housing cover, and the electronics device further comprises a sealant disposed between and contacting a surface of the portion and a surface of the post member so as to surround a portion of the post member.

20. The electronics device of claim 19, further comprising a protrusion which extends from the housing cover and against which the printed circuit board is disposed, wherein the protrusion, the printed circuit board and the post member form a groove in which the sealant and the portion of the housing are disposed.

* * * * *